(12) United States Patent
Mann et al.

(10) Patent No.: US 9,907,185 B2
(45) Date of Patent: Feb. 27, 2018

(54) METHOD OF AFFIXING A GROUP OF ELASTIC FILAMENTS TO AN ELECTRONIC COMPONENT BODY

(71) Applicant: International Business Machines Corporation, Armonk, NY (US)

(72) Inventors: Phillip V. Mann, Rochester, MN (US); Mark D. Plucinski, Rochester, MN (US); Sandra J. Shirk/Heath, Rochester, MN (US); Arvind K. Sinha, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 227 days.

(21) Appl. No.: 14/554,226

(22) Filed: Nov. 26, 2014

(65) Prior Publication Data

US 2015/0082627 A1  Mar. 26, 2015

Related U.S. Application Data

(62) Division of application No. 13/713,430, filed on Dec. 13, 2012.

(51) Int. Cl.
*H05K 3/30* (2006.01)
*H05K 13/00* (2006.01)
*H05K 7/12* (2006.01)

(52) U.S. Cl.
CPC ............... *H05K 3/308* (2013.01); *H05K 7/12* (2013.01); *H05K 13/0053* (2013.01); *Y10T 29/49002* (2015.01); *Y10T 29/49139* (2015.01)

(58) Field of Classification Search
CPC .... H01R 3/306; H01R 12/523; H01R 12/526; H01R 12/55; H01R 12/58; H01R 43/20; H05K 3/308; H05K 7/12; H05K 13/0053; Y10T 29/49002; Y10T 29/49139
See application file for complete search history.

(56) References Cited

U.S. PATENT DOCUMENTS 3,058,083 A    10/1962  Schneider
3,503,033 A *  3/1970   Kennedy, Jr. .......... H05K 3/308
                                              174/261

(Continued)

OTHER PUBLICATIONS

Mann et al., "Electronic Component Retainers," U.S. Appl. No. 13/713,430, filed Dec. 13, 2012.

*Primary Examiner* — Carl Arbes
(74) *Attorney, Agent, or Firm* — Nicholas D. Bowman

(57) ABSTRACT

According to embodiments of the invention, an electronic component assembly may be provided. The electronic component assembly may include an electronic component body. The electronic component assembly may also include one or more elastic members affixed to the electronic component body. The electronic component assembly may also include a catch mechanism affixed to each elastic member adapted to allow insertion of the elastic member and the catch mechanism through a hole of a circuit board in an extended position, and upon release from the extended position, hold the electronic component body in a fixed position by the tension of the elastic member and the catch mechanism grasping an edge of a surface of the circuit board opposite a surface upon which the electronic component body rests.

1 Claim, 4 Drawing Sheets

(56) References Cited

U.S. PATENT DOCUMENTS

| | | | |
|---|---|---|---|
| 3,671,920 A * | 6/1972 | Iantorno | H01R 9/16 174/153 R |
| 4,528,500 A | 7/1985 | Lightbody et al. | |
| 5,096,425 A | 3/1992 | Takahashi | |
| 5,613,877 A | 3/1997 | Patel et al. | |
| 5,726,862 A | 3/1998 | Huynh et al. | |
| 6,109,961 A | 8/2000 | Chen et al. | |
| 6,123,580 A | 9/2000 | Bendorf et al. | |
| 6,168,463 B1 | 1/2001 | Wu | |
| 6,700,800 B2 | 3/2004 | Combs et al. | |
| 6,733,334 B2 | 5/2004 | Chen | |
| 7,029,288 B2 * | 4/2006 | Li | H01L 21/486 257/E23.067 |
| 7,040,902 B2 * | 5/2006 | Li | H01R 13/2464 257/E23.067 |
| 7,503,774 B2 | 3/2009 | Yumi et al. | |
| 7,570,069 B2 | 8/2009 | Cram et al. | |
| 7,604,491 B1 | 10/2009 | Ahmad et al. | |
| 7,896,693 B2 | 3/2011 | Kondo et al. | |
| 7,988,500 B2 | 8/2011 | Furukawa et al. | |
| 8,105,109 B2 | 1/2012 | Honda | |
| 8,118,604 B2 | 2/2012 | Ma | |
| 2002/0076957 A1 | 6/2002 | Low et al. | |
| 2003/0037870 A1 | 2/2003 | Akram et al. | |
| 2003/0073329 A1 * | 4/2003 | Beaman | H01R 9/096 439/66 |
| 2007/0037418 A1 | 2/2007 | Akram et al. | |
| 2008/0220665 A1 | 9/2008 | Darr et al. | |
| 2009/0027156 A1 | 1/2009 | Schlenker et al. | |
| 2009/0111289 A1 | 4/2009 | Vinther et al. | |
| 2009/0298307 A1 | 12/2009 | Rikimaru et al. | |
| 2010/0267291 A1 | 10/2010 | Chabineau-Lovgren | |
| 2011/0059661 A1 | 3/2011 | Inomata et al. | |
| 2011/0141699 A1 | 6/2011 | Hager et al. | |

\* cited by examiner

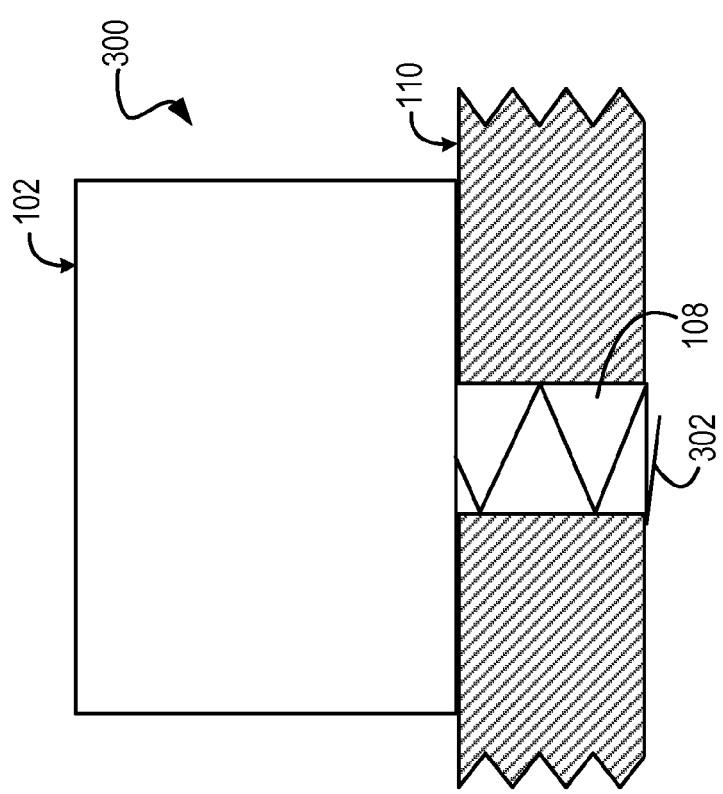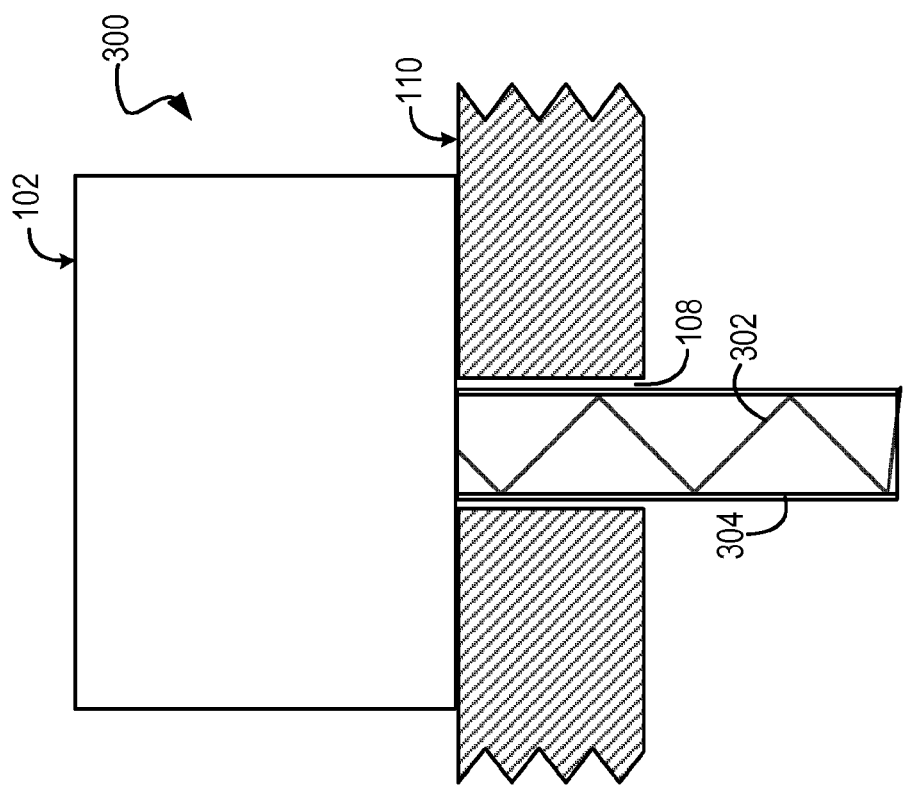

METHOD OF AFFIXING A GROUP OF ELASTIC FILAMENTS TO AN ELECTRONIC COMPONENT BODY

TECHNICAL FIELD

The field of the invention relates generally to electronic components, and more specifically, to retaining electronic components to a circuit board.

BACKGROUND

Computer systems typically include a combination of computer programs and hardware, such as semiconductors, transistors, chips, circuit boards, storage devices, and processors. The computer programs are stored in the storage devices and are executed by the processors. A common feature of many computer systems is the presence of one or more circuit boards. Circuit boards may contain a variety of electronic components mounted to them. Electronic components may be electrically connected to the circuit boards by a soldering process.

SUMMARY

According to embodiments of the invention, an electronic component assembly may be provided. The electronic component assembly may include an electronic component body. The electronic component assembly may also include one or more elastic members affixed to the electronic component body, wherein the elastic members are adapted to extend away from the electronic component body when a tensile force is applied and upon removal of the tensile force return to a natural position. The electronic component assembly may also include a catch mechanism affixed to each elastic member, wherein the catch mechanism is adapted to allow insertion of the elastic member and the catch mechanism through a hole of a circuit board in an extended position, and upon release from the extended position, hold the electronic component body in a fixed position by the tension of the elastic member, wherein the catch mechanism grasps an edge of a surface of the circuit board opposite a surface upon which the electronic component body rests.

According to other embodiments, an alternative electronic component assembly may be provided. The electronic component assembly may include an electronic component body. The electronic component assembly may also include one or more groups of one or more elastic filaments affixed to the electronic component body, wherein the elastic filaments are adapted to deform to a constricted position when a constrictive force is applied and upon removal of the constrictive force return to a natural position. The electronic component assembly may also include a tube adapted to contain each group of filaments in the constricted position in order to allow insertion of the tube and the filaments into respective holes of a circuit board.

According to other embodiments, a method may be provided for creating an electronic component assembly with a board retainer. The method may include providing an electronic component body. The method may also include affixing one or more groups of one or more elastic filaments to the electronic component body which are adapted to deform to a constricted position when a constrictive force is applied and upon removal of the constrictive force return to a natural position. The method may also include placing a tube over each group of one or more elastic filaments, wherein the tube is adapted to contain each group of filaments in the constricted position in order to allow insertion of the tube and the group of one or more elastic filaments into a hole of a circuit board.

BRIEF DESCRIPTION OF THE SEVERAL VIEWS OF THE DRAWINGS

FIG. 3A is a side view of a partial cross section of an electronic component assembly, according to another embodiment of the invention.

FIG. 3B is a side view of a partial cross section of the electronic component assembly of FIG. 3A in an installed position.

In the drawings and the Detailed Description, like numbers generally refer to like components, parts, steps, and processes.

DETAILED DESCRIPTION

Figure 1:
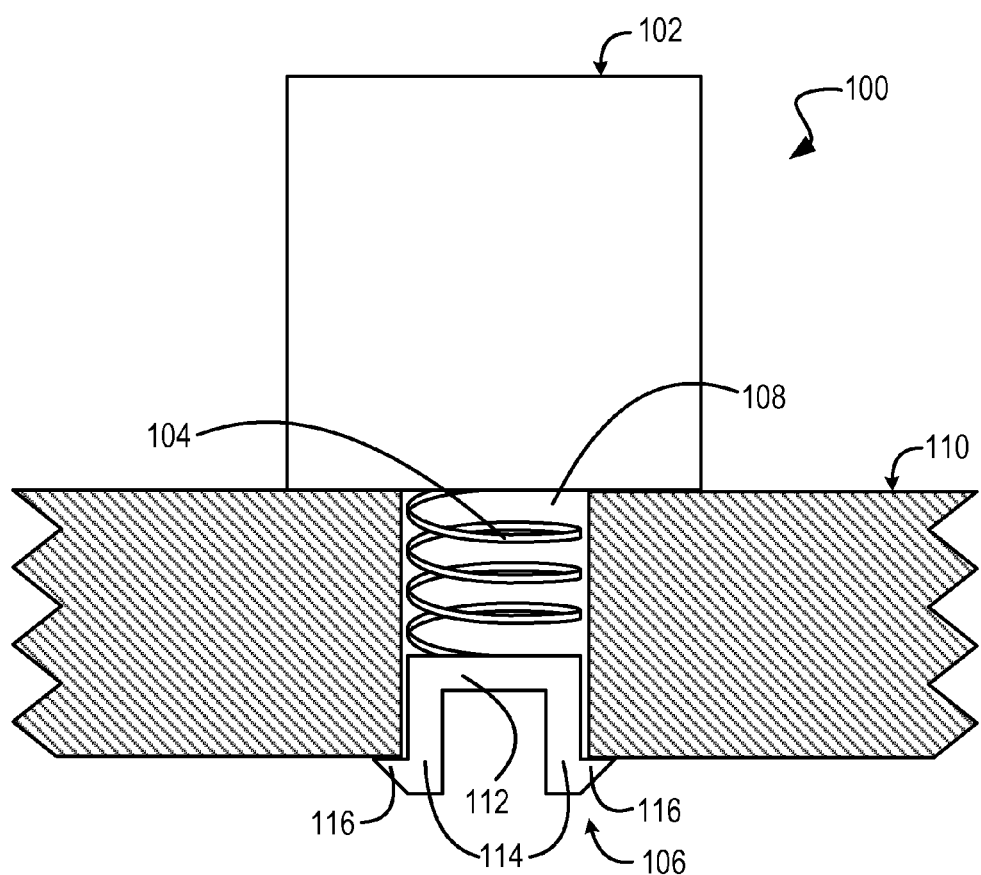
FIG. 1 is a side view of a partial cross section of an electronic component assembly, according to an embodiment of the invention.

Modern day manufacturing methods for the production of circuit boards may include the process of electrically connecting and mechanically attaching electronic components to the circuit board. One method of providing these connections includes placing the electrical connectors of the electronic components on or in the circuit board, and melting and flowing solder to fill any space between the electrical connectors and the circuit board. The electronic components may include a retainer, such as a board lock, that holds the electronic component in place prior to and during the soldering process. A common type of board lock includes a notched member, or shaft, of a fixed length with a type of catch mechanism, such as a flange, near its distal end. The notch allows the distal end to partially collapse so that it may pass through a hole of a circuit board that is smaller that the diameter of the catch mechanism. Upon exiting the hole, the catch mechanism expands and catches the surface of the circuit board opposite of the electronic component, thereby holding the component to the circuit board. A disadvantage of this type of board lock is that its fixed length only allows it to be used with one particular thickness of circuit board, thereby requiring a different board lock for circuit boards of differing thickness. For example, common thicknesses of circuit boards are 0.060 in (1.5 mm), 0.090 in (2.3 mm), and 0.120 in (3.0 mm). Using fixed length board locks for these thicknesses would require three different board locks.

Embodiments of the invention provide a system for retaining electronic components to circuit boards of varied thicknesses prior to and during solder attachment. Embodiments of the invention accomplish this by utilizing one or more elastic elements to provide a continuous tension between the electronic component and the circuit board. In one embodiment, the shaft of a board lock contains coiled or spiraled elastic spring member that allows the board lock to be elongated in order to pass through a hole of circuit boards of varied thicknesses. When the board lock is released a catch mechanism catches the opposite edge of the circuit board and the tension from the spring member holds the electronic component to the circuit board. The catch mechanism may include one or more elastic, cantilevered springs that may deform to permit insertion in a hole. In another embodiment, a board lock includes one or more elastic filaments which have a curved natural position. In order to allow the filaments to be inserted through the hole of a circuit board they may be contained in a tube which has an outer diameter smaller than the hole of the circuit board though which the filaments are inserted. Once the tube and filaments are inserted into the hole, and the electronic component is in its intended position, the tube is removed and the filaments are free to return to their curved natural position, thereby griping the edges of the hole of the circuit board and providing a retaining tension between the circuit board and the electronic component. In another embodiment, the filaments function similarly to the previous embodiment, but instead of a curved natural position, they have a crimped or accordion type natural position or shape.

According to various embodiments, the spring members, filaments, and cantilevered springs described herein may be made of an elastic material. As such, the spring members, filaments, and cantilevered springs may be deformed due to an applied force. When a force is applied, a spring member, filament, or cantilevered spring may flex, stretch, or deform into a constricted or deformed shape (referred to herein as a "deformed" shape or position). Once the force is no longer applied, the spring members, filaments, and cantilevered springs may return to their respective natural, original, or un-deformed shape (referred to herein as a "natural" shape or position). In addition, when a first force is applied and then reduced so that a second, lesser force is applied, a spring member, filament, or cantilevered spring may first deform into a first deformed shape and then deform into a second deformed shape, the second deformed shape being intermediate between the first deformed shape and the natural shape. This intermediate shape may be referred to herein as an "intermediate" shape or position.

Referring to the drawings, wherein like numbers denote like parts throughout the several views, FIG. 1 is a side view of a partial cross section of an electronic component assembly 100, according to an embodiment of the invention. The electronic component assembly 100 may be an element of a computer system such as a mainframe, server, or personal computer. The electronic component assembly 100 may include an electronic component body 102, an elastic member 104, and a catch mechanism 106. The electronic component body 102 may contain a capacitor, inductor, transistor, diode, any other electronic component, or a combination of two or more electronic components. In some embodiments, the combination of two or more electronic components may include two or more different types of the electronic components previously listed. The elastic member 104 may be affixed to the electronic component body 102 at its proximal end, and at its distal end it may be affixed to the catch mechanism 106. The connection between the electronic component body 102 and the elastic member 104, and the elastic member 104 and catch mechanism 106 may include any mode of mechanically connection two elements such as press-fit, molding, adhesives, fasteners, or any similar mode of mechanical connection. The elastic member 104 and the catch mechanism 106 may generally be referred to as a board lock.

The elastic member 104 may be any coiled or spiraled elastic member such as a spring or any other similar elastic member and may be made from a metal, a plastic, or any other suitably elastic material. When a tensile force is applied to the distal end of the elastic member 104 or to the catch mechanism 106, the elastic member 104 and the catch mechanism 106 may extend away from the electronic component body 102. The catch mechanism 106 may include any mechanism capable of passing through a hole 108 of a circuit board 110 and upon exiting the hole 108, catching the edges of the circuit board 110. For example, a catch mechanism 106 may include a body 112 which is affixed to the elastic member 104 on one side. On the opposite side of the body 112, the catch mechanism may include two cantilever springs or beams 114 extending from the body 112. The outer surfaces of the cantilever springs or beams 114 may include one or more flanges 116. The catch mechanism 106 may be made of an elastic material so that the cantilever springs or beams 114 may flex as the catch mechanism 106 is inserted into the hole 108, and upon exiting the hole 108, the cantilever beams 114 resume their natural position and the flanges 116 grasp the edge of the hole 108. The catch mechanism 106 may be made from any suitably elastic material, such as a metal or a plastic, which would allow the catch mechanism 106 to suitably deform in order to fit through the hole 106 and upon exiting the hole 108, resume its natural position.

In various embodiments the electronic component assembly may include any number of board locks. The board locks may provide a mechanically secure connection between the electronic component assembly 100 and the circuit board 104 so the electronic component assembly 100 may remain in a fixed position during a process such as soldering. The elastic nature of this board lock may allow it to be used in securing electronic component assemblies to circuit boards of differing thicknesses. As previously stated, this may include circuit boards with thicknesses such as 0.060 in (1.5 mm), 0.090 in (2.3 mm), or 0.120 in (3.0 mm).

Figure 2A:
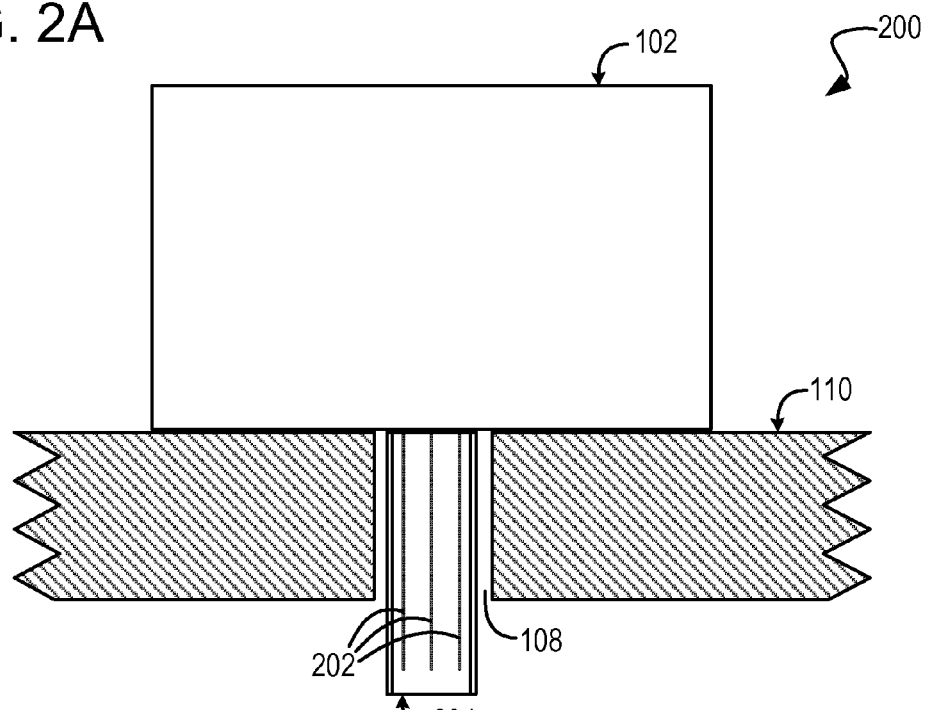
FIG. 2A is a side view of a partial cross section of an electronic component assembly, according to another embodiment of the invention.

FIG. 2A is a side view of a partial cross section of an electronic component assembly 200, according to another embodiment of the invention. The electronic component assembly 200 may include an electronic component body 102, one or more elastic filaments 202, and a removable tube 204. The elastic filaments 202 may be cylindrical or faceted filaments, such as a wire, and may be made from a metal, a plastic, or any other suitably elastic material, and the cross sectional thickness of the elastic filaments 202, may be any suitable thickness, such as 0.125 inches (3.175 mm). The elastic filaments 202 may be of a suitable length that may allow the elastic filaments 202 to pass completely through a hole 108 of a circuit board 110. For example, if the electronic component assembly 200 were to be placed on a circuit board that is 0.090 in (2.3 mm) thick, then the elastic filaments may be at least 0.090 in (2.3 mm) long. However, it may be advantageous to have the elastic filaments as long as twice the thickness of the circuit board. The elastic filaments 202 may be affixed to the electronic component body 102 in a manner that results in the elastic filaments 202 being as close to each other as possible. Also, the elastic filaments 202 may have a natural position that is non-linear which results in the elastic filaments 202 moving away from each other as the extend from the electronic component body 102. For example, the elastic filaments 202 may have a curved natural position.

The removable tube 204 may contain the elastic filaments 202 in a constricted position when the removable tube 204 is in an assembled position. While the elastic filaments 202 are depicted in FIG. 2A as being linear and not contacting the inner sides of the tube 204 in a constricted position, it should be understood that this is for the purpose clarifying the illustration. The elastic filaments 202 may be moderately curved and contact the inner sides of the tube 204 in a constricted position. The removable tube 204 may be made from a metal, a plastic, a ceramic, or any other suitable material that may allow the tube to contain the elastic filaments 202 during insertion into a hole 108 in an assembled position. The removable tube 204 may also allow the removable tube 204 to be removed from the elastic filaments 202. The removable tube 204 may have any outer diameter which may allow the tube to be inserted into a hole 108 of a circuit board 110, and an inner diameter which may allow the tube to contain one or more of the elastic filaments 202.

Figure 2B:
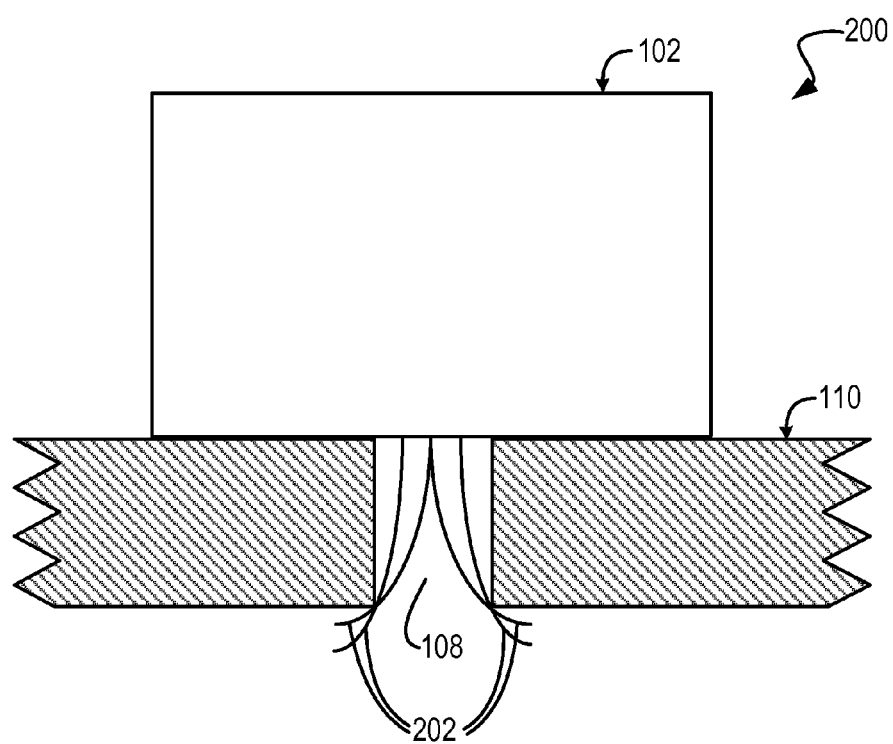
FIG. 2B is a side view of a partial cross section of the electronic component assembly of FIG. 2A in an installed position.

FIG. 2B is a side view of a partial cross section of an electronic component assembly 200 of FIG. 2A in an installed position. The removable tube 204 has been removed from the elastic filaments 202, thereby allowing the elastic filaments 202 to return to an intermediate position. This may result in the elastic filaments 202 contacting the corner of the hole 108 of the circuit board 110. This may provide tension between the elastic filaments 202 and the circuit board 110 and thereby providing tension between the circuit board 110 and the electronic component 102 so that the electronic component 102 may be held in a fixed position during a soldering process. In an embodiment, the electronic component assembly 200 may include a single elastic filament and tube. In other embodiments, as depicted in FIGS. 2A and 2B, the electronic component assembly 200 may include a single group of elastic filaments 202 with a single tube 204. In other embodiments, the electronic component assembly 200 may include multiple sets of a single elastic filament and tube which correspond to multiple holes of a circuit board. In other embodiments, the electronic component assembly 200 may include multiple groups of elastic filaments with a tube for each group, and each group corresponds to a hole of a circuit board. In various embodiments the electronic component assembly may include any number of groups of one or more elastic filaments 202.

FIG. 3A is a side view of a partial cross section of an electronic component assembly 300, according to another embodiment of the invention. The electronic component assembly 300 may include an electronic component body 102, one or more elastic filaments 302, and a removable tube 304. The electronic component assembly 300 may have a similar function to the electronic component assembly 200 of FIG. 2A. The difference in the assemblies may be the shape or position of the elastic filaments 202 and 302 in their natural and constricted positions. While the elastic filaments 202 may have a curved natural position, the elastic filaments 302 may have a crimped or accordion type natural position. The elastic filament 302 may be constricted within the removable tube 304 in order to allow the elastic filament 302 and removable tube 304 to pass through the hole 108 of the circuit board 110.

FIG. 3B is a side view of a partial cross section of an electronic component assembly 300 of FIG. 3A in an installed position. The removable tube 304 has been removed from the elastic filament 302, thereby allowing the elastic filament 202 to return to an intermediate position. This may result in the elastic filament 302 contacting the corner of the hole 108 of the circuit board 110. This may provide tension between the elastic filament 302 and the circuit board 110 and thereby providing tension between the circuit board 110 and the electronic component 102 so that the electronic component 102 may be held in a fixed position during a soldering process. In various embodiments the electronic component assembly may include any number of groups of one or more elastic filament 302.

Figure 4:
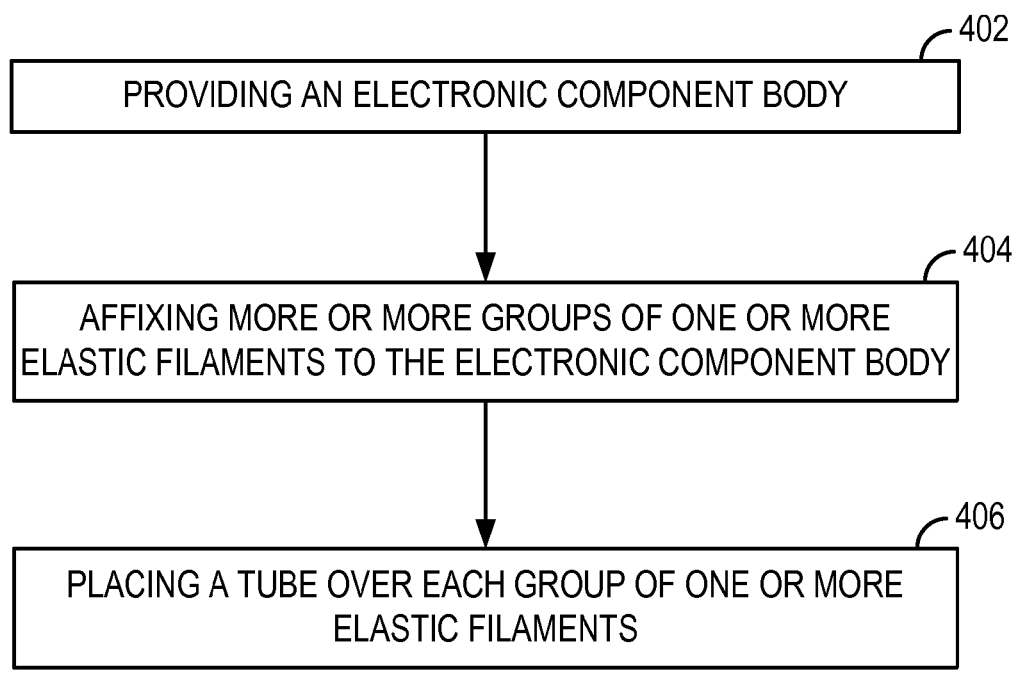
FIG. 4 is a flow chart of a method of creating an electronic component assembly with a board retainer, according to an embodiment of the invention.

FIG. 4 is a flow chart of a method of creating an electronic component assembly with a board retainer, according to an embodiment of the invention. Block 402 may contain the operation of providing an electronic component body. As previously explained, an electronic component body may contain a capacitor, inductor, transistor, diode, any other electronic component, or a combination of two or more electronic components. Block 404 may contain the operation of affixing one or more groups of one or more elastic filaments to the electronic component body. As previously explained, the elastic filaments may be adapted to deform to a constricted position when a constrictive force is applied and upon removal of the constrictive force return to an intermediate position. Block 406 may contain the operation of placing a tube over each group of one or more elastic filaments. As previously explained, the tube may be adapted to contain each group of filaments in a constricted position in order to allow insertion of the tube and the group of one or more elastic filaments into a hole of a circuit board. In other embodiments, the method may also include inserting each group of one or more elastic filaments and the tube into respective holes of the circuit board until the electronic component body contacts a surface of the circuit board. In other embodiments, the method may also include removing the tube from each group of one or more elastic filaments, wherein the elastic filaments are allowed to attempt to return to a natural position and therefore grasp an edge of the hole of the circuit board and thereby hold the electronic component body in a fixed position.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The invention claimed is:

1. A method comprising:
   providing an electronic component body;
   affixing a group of elastic filaments to the electronic component body, each filament of the group of elastic filaments extends away from the electronic component body in a direction parallel to the group of elastic filaments, each filament further deforms to a constricted position when a constrictive force is applied, and upon removal of the constrictive force, return to a natural position;
   placing a tube over the group of elastic filaments, the tube contains the group of filaments in the constricted position in order to allow insertion of the tube containing the group of elastic filaments into a hole of a circuit board;
   inserting the group of one or more elastic filaments contained by tube into a hole of the circuit board until the electronic component body contacts a surface of the circuit board; and
   removing the tube from the group of elastic filaments, wherein the group of elastic filaments is allowed to return to a natural position, wherein the group of elastic filaments grasps an edge of the hole of the circuit board, thereby holding, with a tensile force, the electronic component body in a fixed position against a surface of the circuit board.

* * * * *